United States Patent
Burzio

[19]

[11] Patent Number: 6,127,896

[45] Date of Patent: Oct. 3, 2000

[54] PHASE LOCKED LOOP HAVING CONTROL CIRCUIT FOR AUTOMATICALLY OPERATING VCO ON AN OPTIMUM INPUT/ OUTPUT CHARACTERISTIC

[75] Inventor: Marco Burzio, Turin, Italy

[73] Assignee: CSELT—Centro Studi E Laboratori Telecomunicazioni S.p.A., Turin, Italy

[21] Appl. No.: 09/156,930

[22] Filed: Sep. 18, 1998

[30] Foreign Application Priority Data

Nov. 6, 1997 [IT] Italy ................................ TO97A0970

[51] Int. Cl.[7] ................................................ H03L 7/099
[52] U.S. Cl. ................................ 331/17; 331/34; 331/57
[58] Field of Search .......................... 331/17, 34, 57

[56] References Cited

U.S. PATENT DOCUMENTS 5,075,640 12/1991 Miyazawa ............................... 331/10

FOREIGN PATENT DOCUMENTS 40 31 939 A1 5/1992 Germany.

OTHER PUBLICATIONS

Novof et al, "Fully Integrated CMOS Phase–Locked Loop with 15 to 240 MHz Locking Range and ±50 ps Jitter" ISSCC Dig. Tech. Papers, pp. 112–113, Feb. 1995.

"Towards a Channel Allocation Scheme for SDMA–Based Mobile Communication Systems", Notker Gerlich, University of Wurzburg Institute of Comp.Science . . . , Report No. 104, Feb. 1995.

*Primary Examiner*—Siegfried H. Grimm
*Attorney, Agent, or Firm*—Herbert Dubno

[57] ABSTRACT

A phase locked loop (1) including an oscillator (5), usually made as a voltage controlled oscillator (VCO), arranged to operate selectively according to different input/output characteristics. The circuit further includes a control circuit (81) for selectively controlling the operation of the oscillator (5) thereby making the oscillator (5) itself operate on one of an optimum characteristic selectively determined according to the operating conditions of the loop (1).

10 Claims, 10 Drawing Sheets

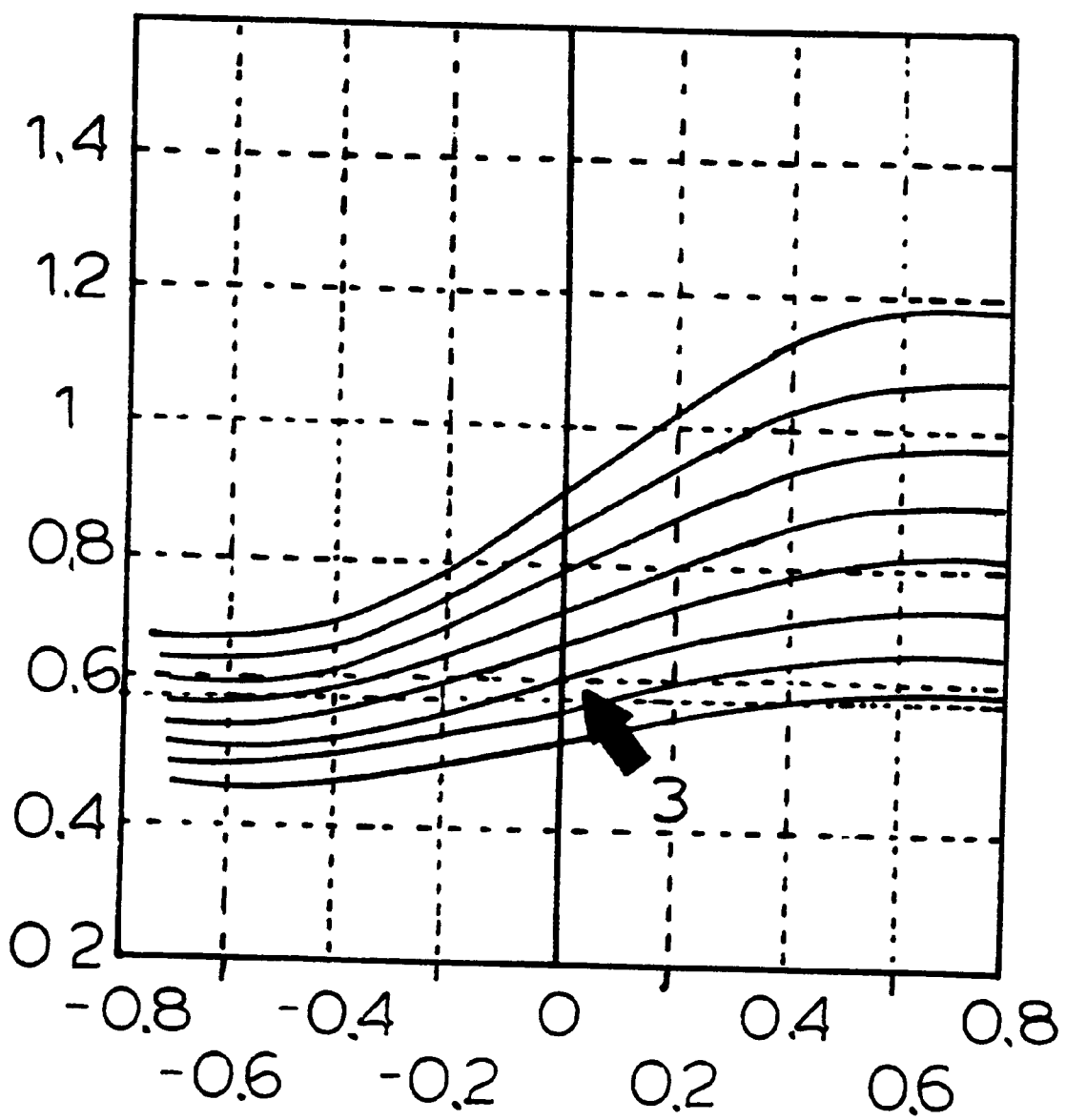

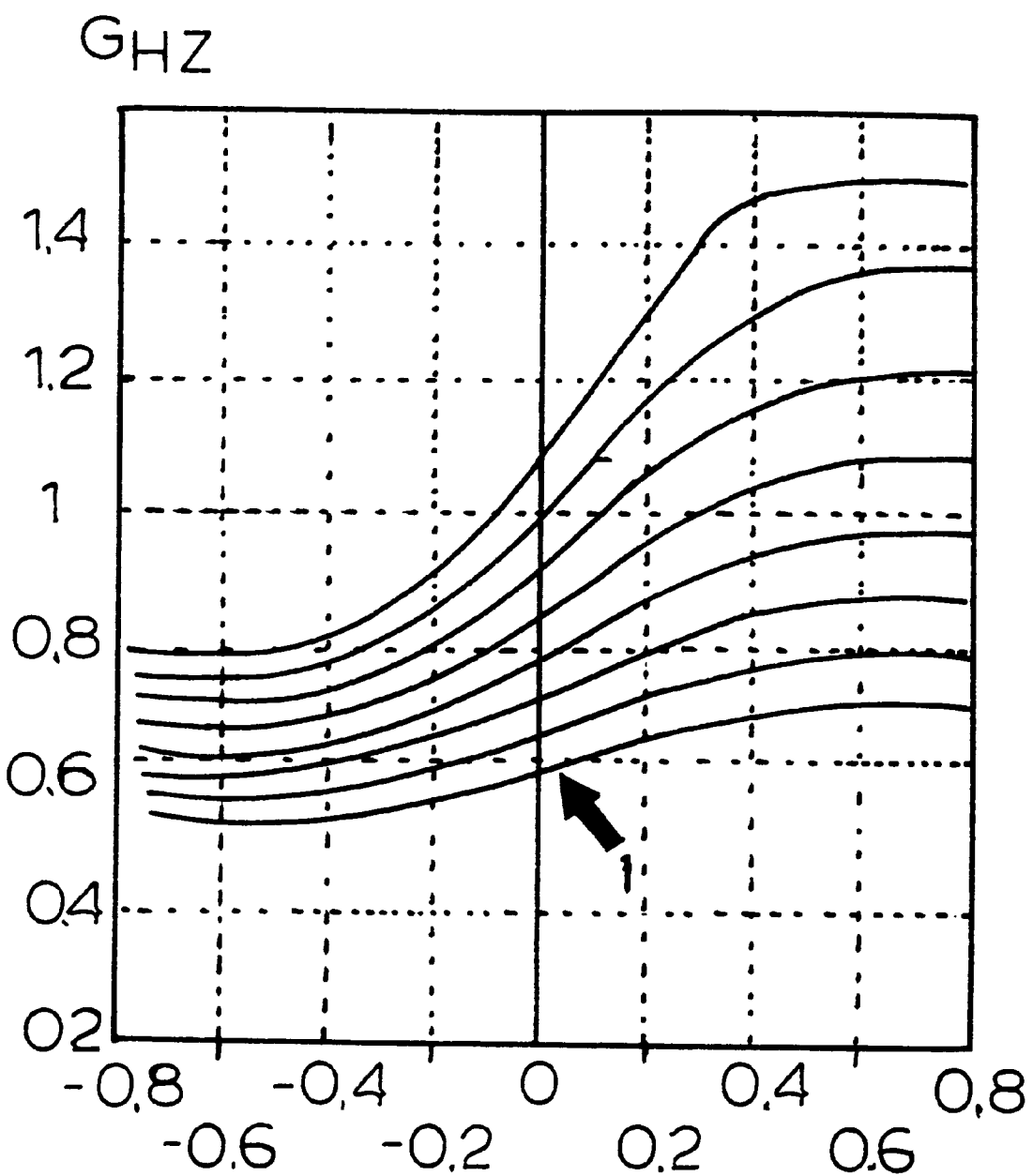

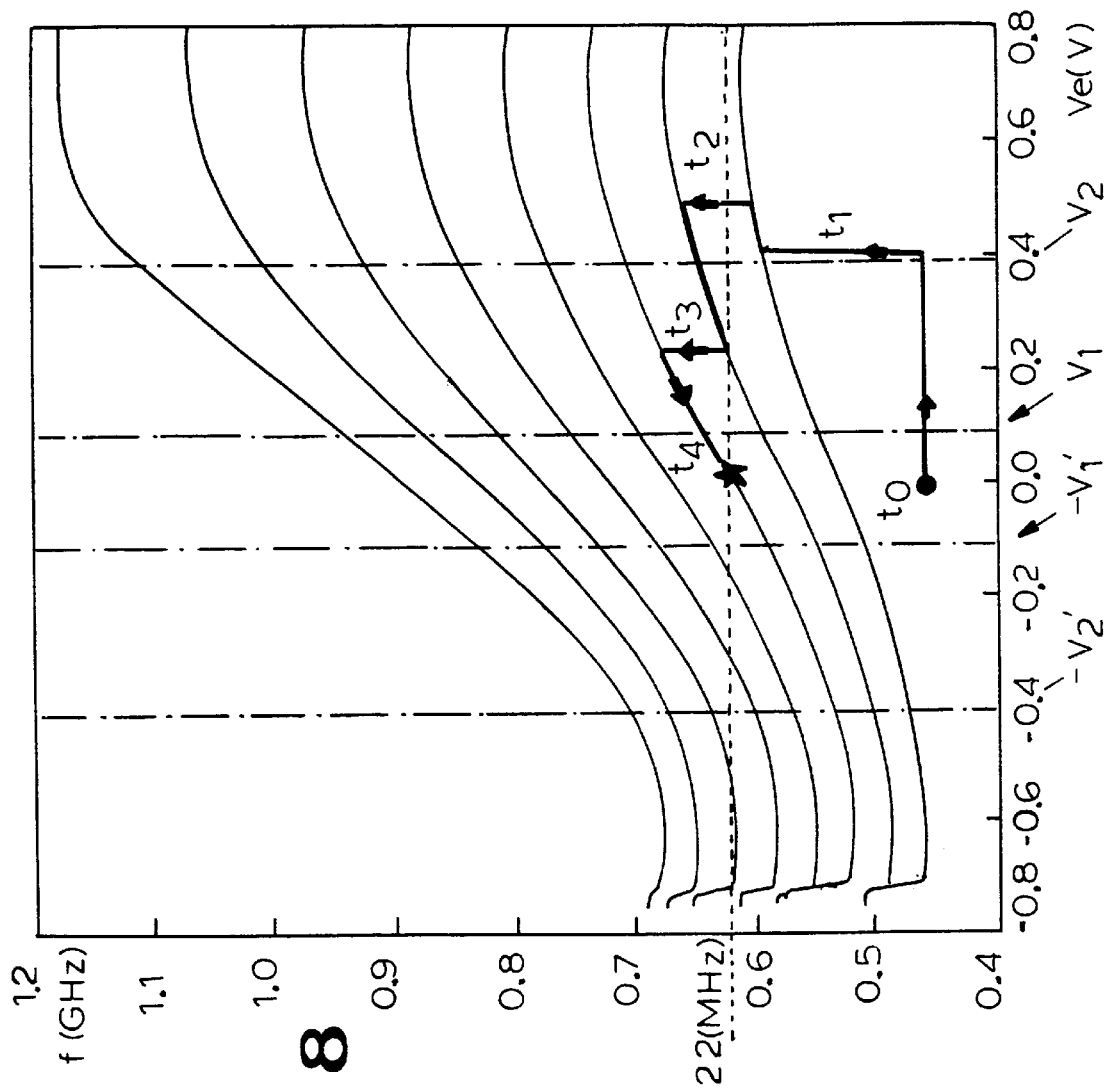

PHASE LOCKED LOOP HAVING CONTROL CIRCUIT FOR AUTOMATICALLY OPERATING VCO ON AN OPTIMUM INPUT/OUTPUT CHARACTERISTIC

FIELD OF THE INVENTION

The present invention relates to a phase locked loop (PLL) circuit.

BACKGROUND OF THE INVENTION

PLL's have been originally devised to solve the problem of locking the phase of the carrier in a receiver and they have subsequently found employ in the most diverse sectors, such as frequency synthesis, in its various applications, or automatic controls.

OBJECT OF THE INVENTION

The purpose of the present invention is to provide a PLL characterized by a low jitter value and suitable in fast clock distribution within integrated circuits or printed circuit boards, or, more generally, in applications that require frequency synthesis.

SUMMARY OF THE INVENTION

Specifically the invention provides a PLL destined to accomplish phase locking and/or frequency locking and multiplication on a clock signal, for instance for SDH (Synchronous Digital Hierarchy) applications, and having the following characteristics:
  output frequency: 19–622 MHz,
  input frequency: 19–155 MHz,
  low jitter value (for instance in accordance with the ITU-T recommendation G.783 which, for SDH applications, prescribes a jitter value lower than 0.01 rms information units, which corresponds to a value of 16 ps at 622 MHz frequency).

It is wholly evident that the values mentioned above have the sole purpose of allowing the person skilled in the art to have a more precise idea of the magnitudes involved in the context under consideration. Therefore they must in no way be taken to limit the scope of the invention.

BACKGROUND OF THE INVENTION

Conventionally, PLL's include an input phase (and possibly frequency) comparator stage (and possibly a frequency comparator), followed by a so-called loop filter (usually a low-pass filter) and then by an oscillator (usually a Voltage Controlled Oscillator or VCO).

The output signal deduced or derived from the output of the oscillator is fed back to the input of the input comparator stage through a feedback loop. The presence of frequency divider circuits, for instance, in the feedback loop allows making the circuit operate as a frequency multiplier circuit. The presence of divider circuits upstream of the comparator allows extending the frequency multiplication function to output frequency/input frequency ratios other than a whole number. These concepts are well known to the person skilled in the art and therefore do not require illustration in greater detail.

It is also known that, if a PLL is to be obtained in the form of an integrated circuit or of a circuit suitable for being integrated, it is necessary to take into account several limiting factors.

For the oscillator a loop structure usually needs to be used, since it is not practically possible to use an LC oscillator due to the well known limitations inherent to the manufacture of inductors at the integrated circuit level, particularly for CMOS technology which is commonly used in the applications envisioned for the invention.

The need to construct the loop filter as a part of the integrated circuit also compels, for construction reasons, to use small capacitance values with respect to the values that are suited for its manufacture as a circuit with discrete components.

Another difficulty is that the integration process may give rise to variations in the behaviour of the components, and hence of the circuits, with respect to the ideal parameters expected, and these variations add to the variability factors inherent in the variations of the power supply voltage and of the operating temperature. Such factors take on particular importance in the case of CMOS technology.

Another possibly critical factor stems from the need to make a judicious choice of the cut-off frequency in the jitter transfer function, which ideally should be chosen as low as possible in order to boost the jitter reduction effect by the filter. The latter need in fact is in contrast with the impossibility of obtaining high capacitance values of the filter.

OBJECT OF THE INVENTION

The object of the invention therefore is to provide a PLL that is capable of meeting the operating requirements described above while still taking into account the intrinsic limitations.

SUMMARY OF THE INVENTION

In accordance with the present invention, this object is attained in a phase locked loop having the characteristics specifically disclosed.

In particular, the solution according to the invention offers the possibility of choosing the operating characteristic of the oscillator, with the consequent possibility of lowering the value of the sensitivity (Ko) of the oscillator itself, and of maintaining such sensitivity essentially constant with variations in quantities such as, for instance, temperature, power supply voltage and the parameters of the integration process. This results in the possibility of keeping the characteristic frequency of the loop at a reduced value, without excessively penalizing the sensitivity (Kd) of the input comparator, even in the presence of values of the capacitance of the loop filters which are necessarily kept limited as an effect of the integration process.

Though the introductory part of the present description and the subsequent detailed description of an embodiment of the invention refer to a PLL destined to be realised in the form of an integrated circuit, the scope of the invention should in no way be taken to be limited to this specific context. In practice, the invention finds application in all situations wherein the problems stated above arise, individually or in combination. This applies in particular with respect to the manufacture of the oscillator.

BRIEF DESCRIPTION OF THE DRAWING

The above and other objects, features, and advantages will become more readily apparent from the following description, reference being made to the accompanying drawing in which:

FIGS. 3A to 3C are diagrams showing the operating characteristics of the element shown in FIG. 2;

FIG. 8 shows in detail the operation of the part of circuit, to which FIGS. 4 through 7 refer.

SPECIFIC DESCRIPTION

Figure 1:
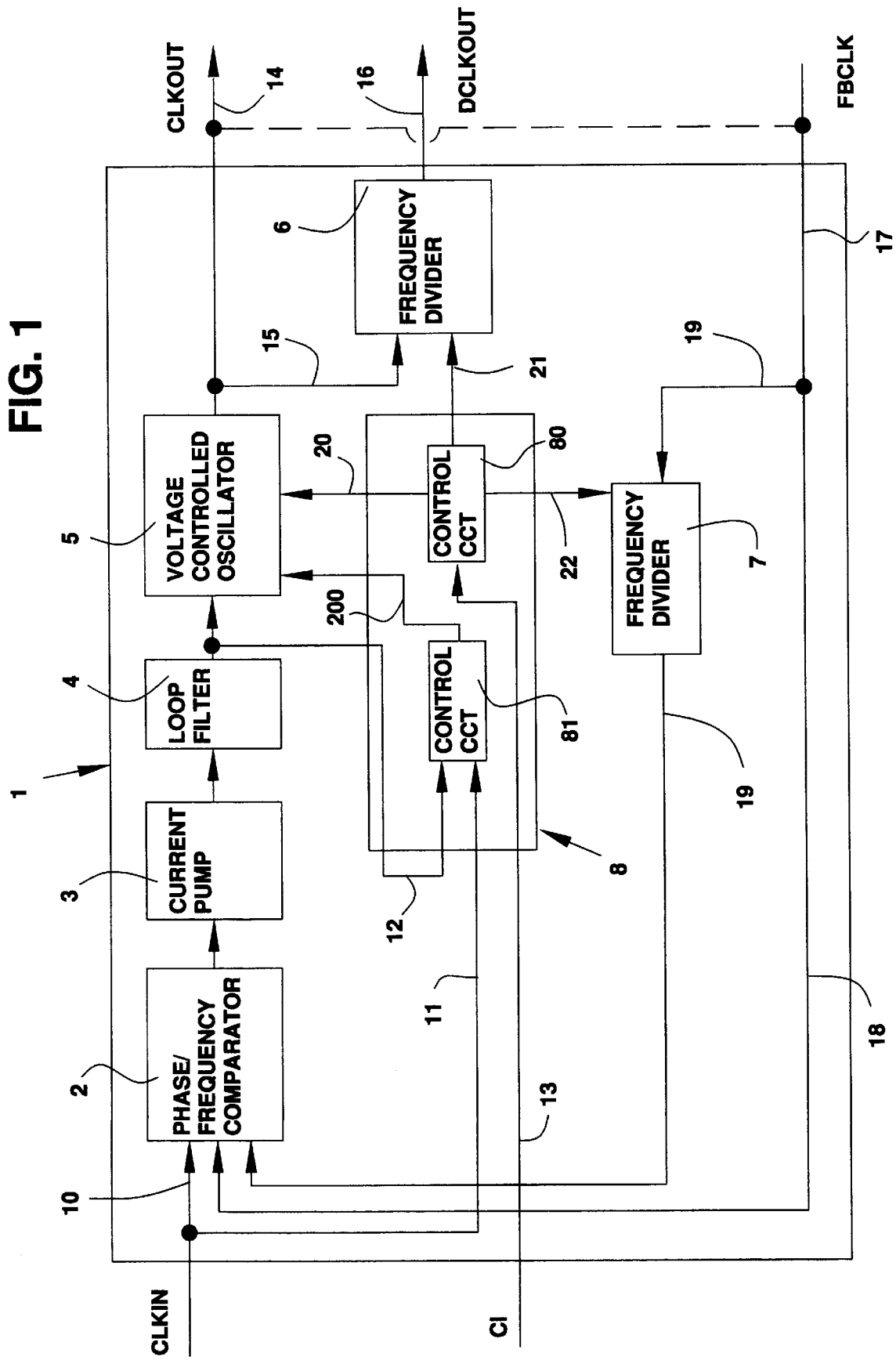
FIG. 1 is a general block diagram of the structure of a circuit a general block diagram, the structure of a circuit according to the invention.

In the block diagram in FIG. 1, a PLL circuit 1 comprises the following elements or modules:

- a phase/frequency comparator 2 having associated, therewith, as an output circuit, a circuit 3 of the type commonly called a "current pump",
- a loop filter 4 which receives the output signal of the current pump 3,
- an oscillator 5, configured as VCO (voltage-controlled oscillator) and driven by the output signal of the loop filter 4,
- a first frequency divider 6 which acts on the output signal of the oscillator 5,
- a second frequency divider 7 inserted, in the way that shall be better described hereafter, in the feedback loop of the circuit, and
- a general control module 8 destined to allow the reconfiguration of the circuit in the way better described hereafter.

In particular control module 8 has been shown here as being ideally subdivided into two parts, indicated as 80 and 81 respectively. Hereafter, for the sake of simplicity, the term "control module" will also be used to indicate each of the two parts. Of such two parts, the part 80 performs the normal function of controlling the operation of the PLL, in particular by intervening on the oscillator 5 as well as on dividers 6 and 7 according to a configuration signal C1 coming from outside through a line 13. The references 20, 21 and 22 show three lines through which the control module 80 acts, respectively, on the oscillator 5, on the first divider 6 and on the second divider 7. The part 81 instead is specifically dedicated to controlling the operation of the oscillator 5, through a line 200.

The clock signal for which the phase lock and/or frequency lock and multiplication functions are to be performed according to the embodiment described herein has been denoted CLKIN. This signal is carried through a line 10 to the input of the comparator 2 and, through a line 11, to one of the inputs of the control module 81. The latter also receives, through a second line 12, a driving signal related with the output of the comparator 2, in particular the output signal of the loop filter 4. This choice is anyway not to be taken as mandatory: an essentially similar function could be performed, for instance, by the output of the current pump 3. In any case, driving the control module 81 starting from the output of the loop filter 4 is found advantageous because this allows taking advantage of the filtering action of the filter 4 itself.

The output signal CLKOUT of the oscillator 5 constitutes the output signal of the circuit, present on a line 14. The same signal is also sent, through a line 15, to the divider 6 which derives therefrom a frequency-divided output signal DCLKOUT, present on a line 16.

A feedback signal FBLCK, present on a line 17, is fed back towards the comparator 2 both through a direct line 18 and through a secondary line 19 which passes through the second divider 7. As is easily understood by the person skilled in the art, the accessibility of the line 17 from outside the circuit 1 is destined to allow a greater flexibility in closing the feedback loop.

The feedback action towards comparator 2 can therefore be effected both starting from the output signal CLKOUT present on the line 14 and starting from the frequency-divided signal DCLKOUT present on the line 16, as well as from any other element positioned downstream of the lines 14 and 16. This choice can be found advantageous to take into account, for instance, additional phase displacements that may be induced by those downstream elements. In any case this is a preferential and not mandatory choice and, in the remainder of the present description, it may ideally be imagined that the feedback line 17 is simply closed on the output line 14 as schematically shown in FIG. 1 with a dashed line.

Similarly optional is the presence of two dividers 6, 7 whose function is to generate a frequency divided output signal DCLKOUT and, respectively, to allow the frequency multiplication.

The splitting of the feedback path into the two lines 18, 19 is destined to account for the fact that, in essential analogy with what has been stated above in regard to the output of the circuit 1, the divider 7 may introduce in the feedback loop delays that cannot be exactly determined. Hence one can provide, according to known criteria, for the circuit I to be activated initially by making the comparator 2 exploit, as feedback line, the "direct" line 18, thereby allowing the desired locking conditions to be reached in the circuit. When this condition is attained, the comparator 2 can then take into account the signal present on the line 19 wherein the divider 7 is inserted. This allows the latter to perform its function (in practice, in the form of a "decimation" of order N of the pulses comprising its input signal) without modifying the lock conditions set by using the direct line 18.

Figure 2:
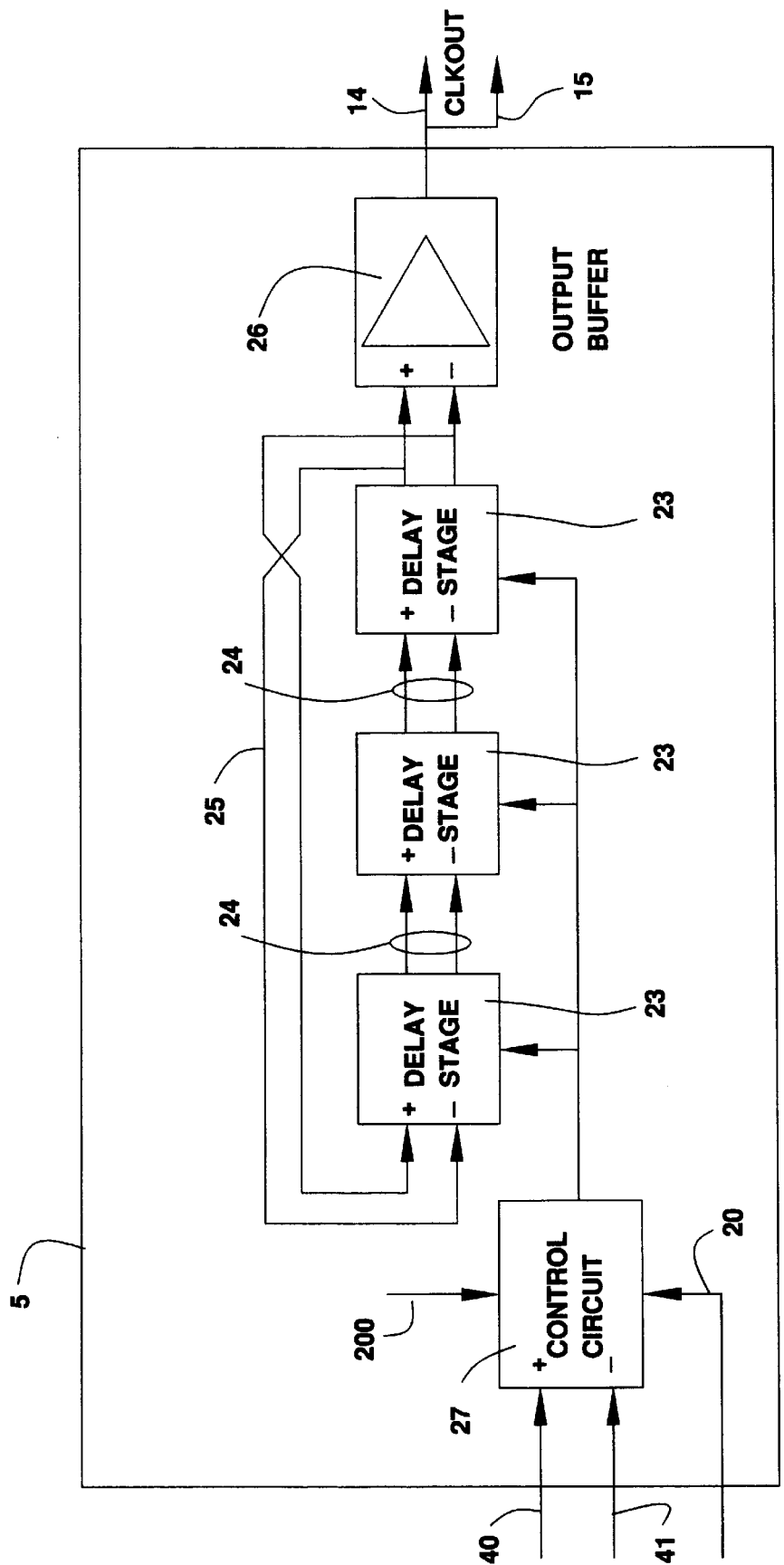
FIG. 2 is a block diagram which shows a possible structure of a first element of the circuit shown in FIG. 1.
Figure 4:
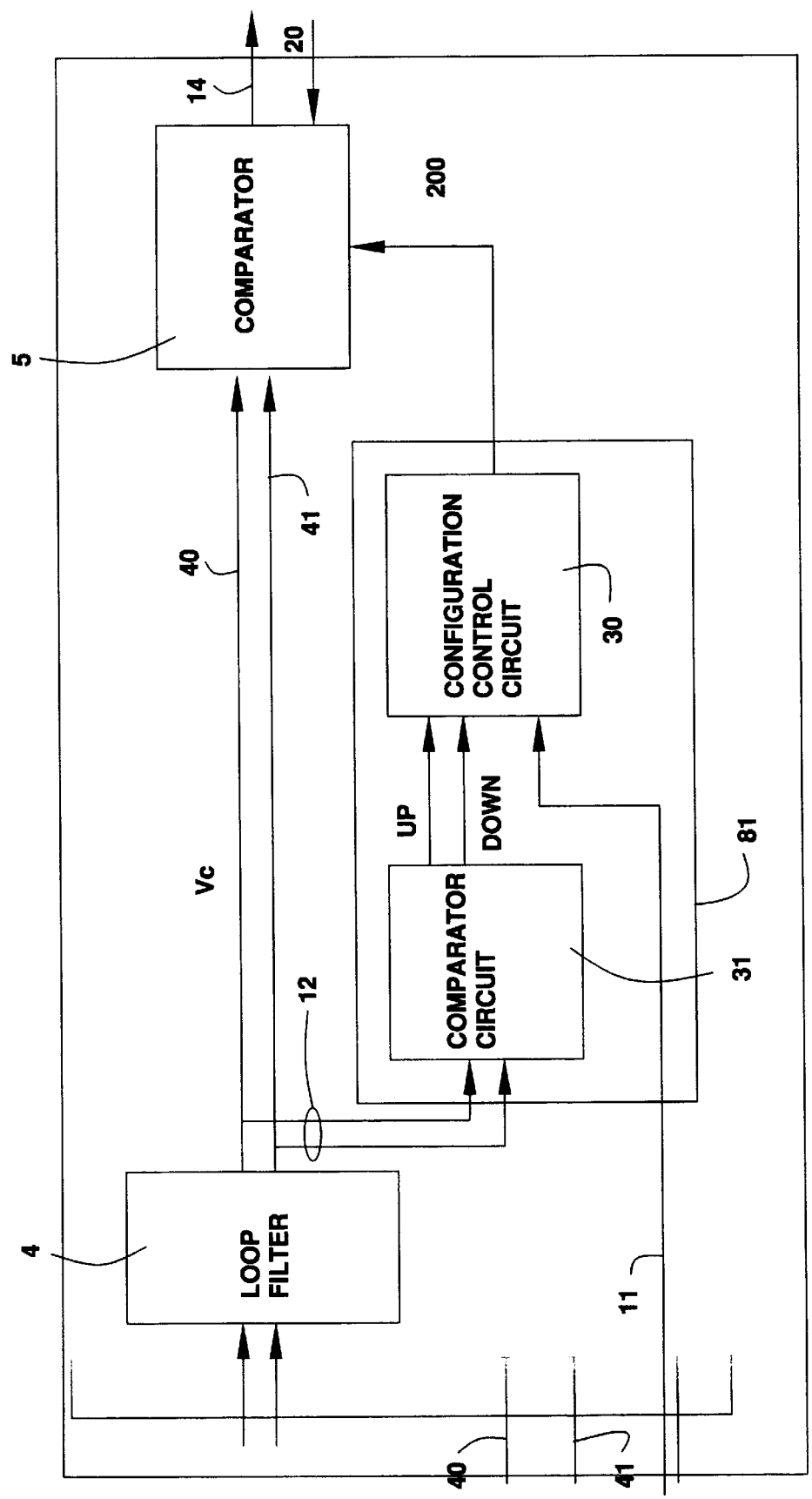
FIG. 4 is a block diagram which shows in greater detail a second element of the circuit shown in FIG. 1.

A preferred characteristic of the circuit 1 (characteristic which is not shown for the sake of simplicity in the general diagram in FIG. 1, but which can be seen, for instance, in FIGS. 2 and 4, relating to the individual elements) is the use of a differential structure at least for the current pump 3, the loop filter 4 and the oscillator 5. The term differential structure is meant to indicate in general a structure wherein the signal transferred from one element to another actually comprises the difference between the signal values (typically voltage values) present on two complementary lines, respectively positive and negative (or inverting). This choice offers, among other factors, the advantage of offering a lesser sensitivity to noise, in particular to noise on the power supply, also giving rise to a lesser generation of disturbances (for it is possible to work with smaller and complementary signals, with circuits that operate in linear zone).

The diagram in FIG. 2 shows in greater detail the structure of the oscillator 5, constructed, as stated above, according to the typical configuration of a Voltage Controlled Oscillator or VCO. The structure is known, but it is shown to ease understanding of the invention.

In the embodiment shown, the oscillator 5 comprises three delay elements or stages 23 connected in cascade: The drawing clearly shows the complementary structure of the respective connecting lines 24 as well as of the feedback line 25 which connects (in an inverting manner, i.e. by creating a negative feedback) the output of the delay element 23 farthest downstream with the input of the element located farthest upstream.

The reference 26 indicates an output buffer circuit which acts on the output signal of the element 23 farthest downstream thereby making it suitable for being sent on the line 14 (and on the line 15, if present).

The reference 27 indicates a control circuit that receives at its input (preferably in complementary configuration, through two lines indicated respectively as 40 and 41) the output signal of the loop filter 4. The circuit 27 further requires, as configuration control signals, the signals incoming on the lines 20 and 200.

The oscillator diagram shown in FIG. 2 provides for frequency control to be effected by varying the output impedance of the individual stage (or element) 23, also aiming at obtaining a constant voltage range at the output of the individual stage. The related control procedures starting from module 27 essentially correspond to those described for instance in "Fully Integrated CMOS Phase-Locked Loop with 15 to 240 MHz Locking Range and ±50 ps jitter" by Ilya Novof et al., in ISSCC Dig. Tech. Papers, February 1995, pages 112–113.

Figure 7:
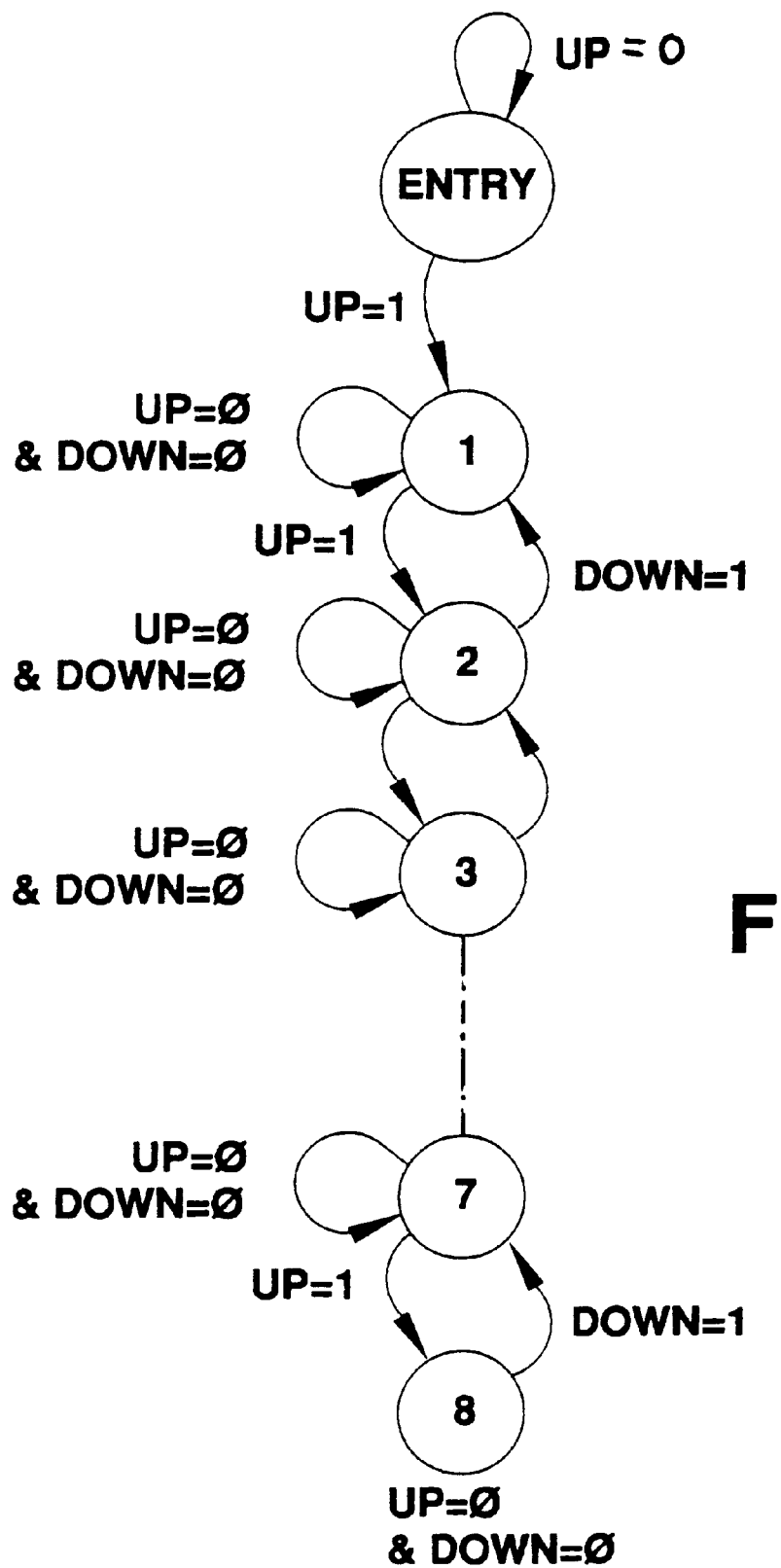
FIG. 7 shows, in the form of a state diagram, the operation of the part shown in FIG. 6.

The control module 80 acts on the module 27 through the input 20 in the way described in the aforementioned work by Novof et al., in particular with reference to FIG. 7, thereby allowing constructing the filter 4 as an essentially capacitive component, and also controlling the damping of the circuit according to the division factors of the dividers 6 and 7.

Figure 3A:
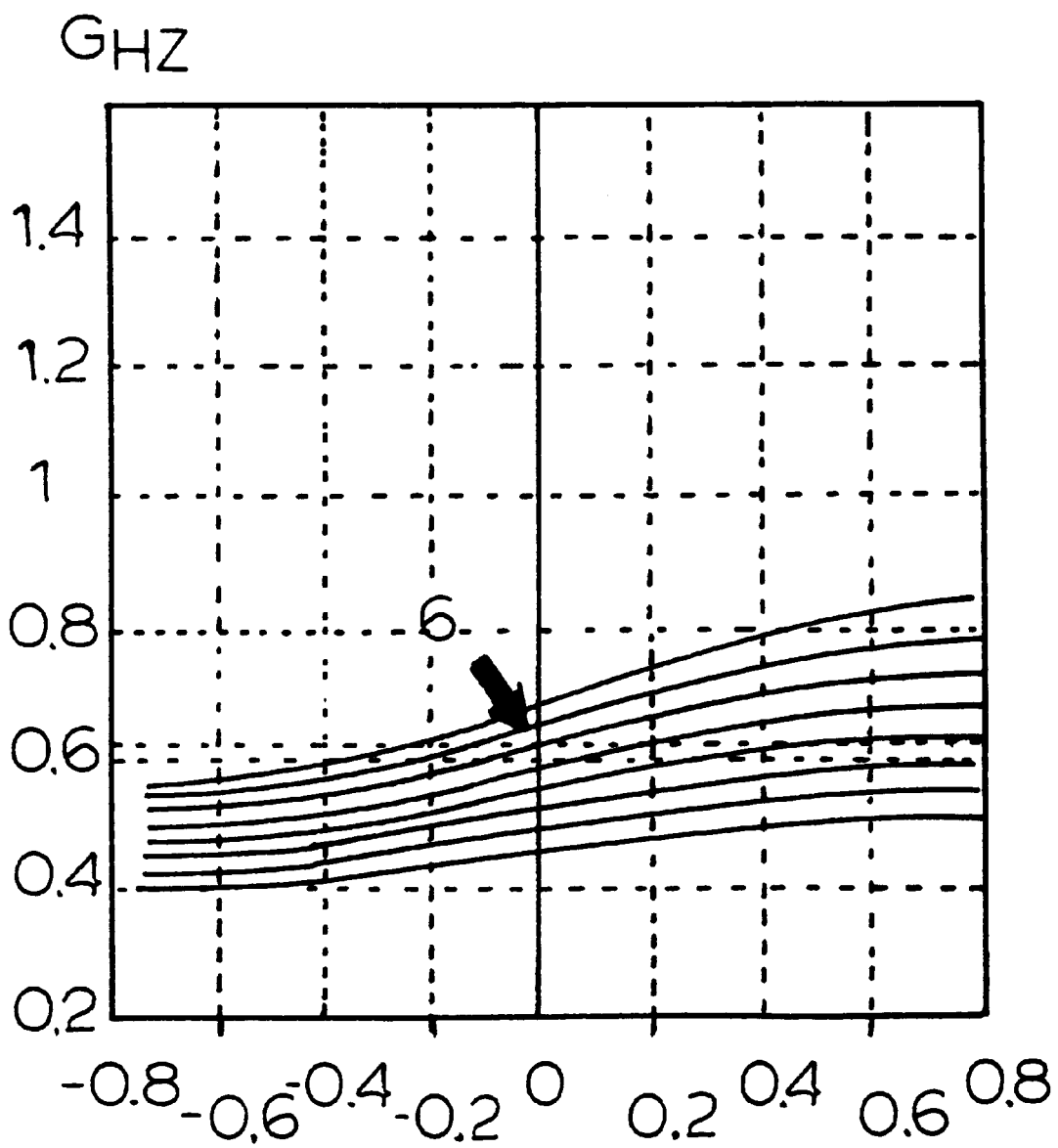

The control module 81 acts on the module 27 through the input 200 in such a way that the VCO operates in one of the several frequency/voltage characteristics as shown schematically in the diagrams of FIGS. 3A–3C.

These Figures correspond to the behavior of the frequency/voltage characteristic of the oscillator 5 measured under three different conditions, and; in particular under three different temperature levels and three different results of the technological process, namely:

very high ambient temperature (for instance 80° C.) and slow process parameters (FIG. 3A), normal ambient conditions (25° C.) and typical process parameters (FIG. 3B), rather cold ambient conditions, such as those which may occur as an effect of exposing the circuit to the action of a refrigerating device, and fast process parameters (FIG. 3C).

The terms "fast parameters" and "slow parameters" have been used since the variability of the results of the technological process translates in practice into a higher or lower operating speed of the component.

For each condition, there is a family of characteristics (eight in the embodiment shown). The various characteristics in each family correspond to a different configuration whereby the oscillator 5 is driven by the circuit 27, i.e. to a number of different behaviors of the output frequency versus the input voltage for different values of the logic combination applied on the line 200.

By way of example it can be imagined that the lowermost characteristic in FIGS. 3A–3C corresponds to an input logic combination "000" on the line 200, whereas the uppermost characteristic corresponds to a different combination, such as "111". Of course, while retaining the principle unchanged, the described embodiment may be implemented by using a greater or smaller number of characteristics or yet again, at least theoretically, with the possibility of choosing the individual characteristic adopted within a range that is no longer discrete (as in the case of the embodiment shown) but continuous or essentially continuous.

It should further be observed that, while the present detailed description refers specifically to temperature as the parameter determining the variation of the characteristics, a behavior of the same nature can be noted—mutatis mutandis—as a function of other parameters such as power supply voltage or other variables of the integration process.

The parameters represented by the characteristics highlighted above may be critical for the correct operation of the device.

For example, it is possible to demonstrate that the pulsatance corresponding to the cut-off frequency of the transfer function of the phase of the PLL can be expressed with the following relation $$\omega_n = \sqrt{\frac{2Kd \cdot Ko}{NC}} \qquad (I)$$

where $\omega_n$ is the pulsatance in question, N is the division factor of the divider 7 (if present; should that divider not be present, then N=1), C is the capacitance value corresponding to the behaviour of the filter 4 whilst Kd and Ko are the sensitivities of the comparator 2 and of the oscillator 5.

Specifically, the (current) signal $i_d$ generated by the set of comparator 2 and current pump 3 can be expressed as $$i_d = Kd\theta_e \qquad (II)$$

where $\theta_e$ is the phase deviation present at the input of the comparator 2.

The pulsatance $\omega_o$ at the output of the oscillator 5 can instead be expressed by the relation $$\omega_0 = KoV_c \qquad (III)$$

where Vc represents the signal (in voltage, usually differential) at the input of the oscillator.

Formula (I) allows understanding that the impossibility of synthesising high values of capacitance C compels to keep low the value of the product Kd Ko in order to keep the value of the pulsatance $\omega_n$ limited. In practice, for the frequency values indicated in the introductory part of the specification, it is preferred for that pulsatance to remain at values corresponding to frequencies in the order of 1–2 MHz. Value Kd, indicative of the sensitivity of the comparator 2, cannot decrease below a certain value because of the need to prevent the signal itself from being excessively penalised by noise. Hence the need arises to try to limit as far as possible the value Ko, representative of the frequency/voltage gain of the oscillator; this also prevents the oscillator itself from excessively amplifying the noise present at the output of the filter 4.

Thus, for instance, a PLL essentially similar to circuit 1 described here, wherein however the VCO 5 presents a single operating characteristic, for instance the uppermost characteristic in the three diagrams in FIGS. 3A–3C, could be overall acceptable in the case of operation at 80° C. (FIG. 3A). However, it would be wholly unacceptable (because it would correspond to an excessively high value of gain) in the case of operation at 0° C. (observe the uppermost curve in the diagram in FIG. 3C).

The provision, according to the invention, of an oscillator 5 with variable characteristic, in particular with the possibility of being made to operate according to a frequency/voltage characteristic selectively identified within a range of available characteristics, allows optimizing the operation of the circuit by adapting the behaviour of the oscillator 5 to the specific conditions (temperature, power supply voltage, process parameters).

For instance, it is possible, when operating at a temperature in the order of 25° C. and under typical process conditions, to make the control module 81 intervene on the oscillator 5 to make it operate with the characteristic corresponding to the third curve from the bottom in the diagram in FIG. 3B. When the circuit 1 operates, for instance, at about 80° C., the same module 81 can intervene on the oscillator 5 in such a way as to make it operate according to a characteristic corresponding to the sixth curve starting from the bottom in the diagram in FIG. 3A. Lastly, when operating, for instance, at about 0° C., the same module 81 can intervene on the oscillator 5 in such a way as to make it operate according to the characteristic 1, i.e. the lowest one in the diagram in FIG. 3C.

By comparing the various diagrams in FIGS. 3A–3C one can see that the practical effect of the adaptation function just described is that of keeping limited and essentially constant the sensitivity of the oscillator 5 as the parameters vary.

The adaptation of the operation of the oscillator 5 can be effected, as a function of the working frequency, as a veritable calibration action effected on the circuit. Once the circuit is manufactured, (for instance in the form of an integrated circuit), its operation can be adjusted according to the conditions of use in such a way as to optimise its behaviour, for instance, as a function of the process parameters (generally not controllable a priori).

FIGS. 4 and 7 refer to a preferred embodiment where such adjustment becomes an automatic adaptation function. The circuit can thus be configured in such a way that, upon activation, it is able to place itself automatically on the operating characteristic of the oscillator 5 that corresponds to the desired optimal conditions, with the possibility of subsequently choosing another characteristic when the one adopted previously is no longer to be considered optimal.

In this regard one should however take into account that, especially in applications to the synchronization of complex circuits, the transition of the oscillator 5 from one operating characteristic to another may constitute an undesired phenomenon, as it may give rise, for instance, to a "jump" of one period in the clock signal. In those applications it seems therefore preferable, once a given characteristic is adopted upon circuit activation, for the oscillator 5 to be maintained on that operating characteristic even when it has become sub-optimal, except in presence of sizeable phenomena (for instance a strong variation in the input frequency of the device), such as to make the adopted characteristic so unsatisfactory that the onset of a negative phenomenon like the jump of one synchronization period is nevertheless preferable to continuing operation on a characteristic that has become sub-optimal.

Figure 6:
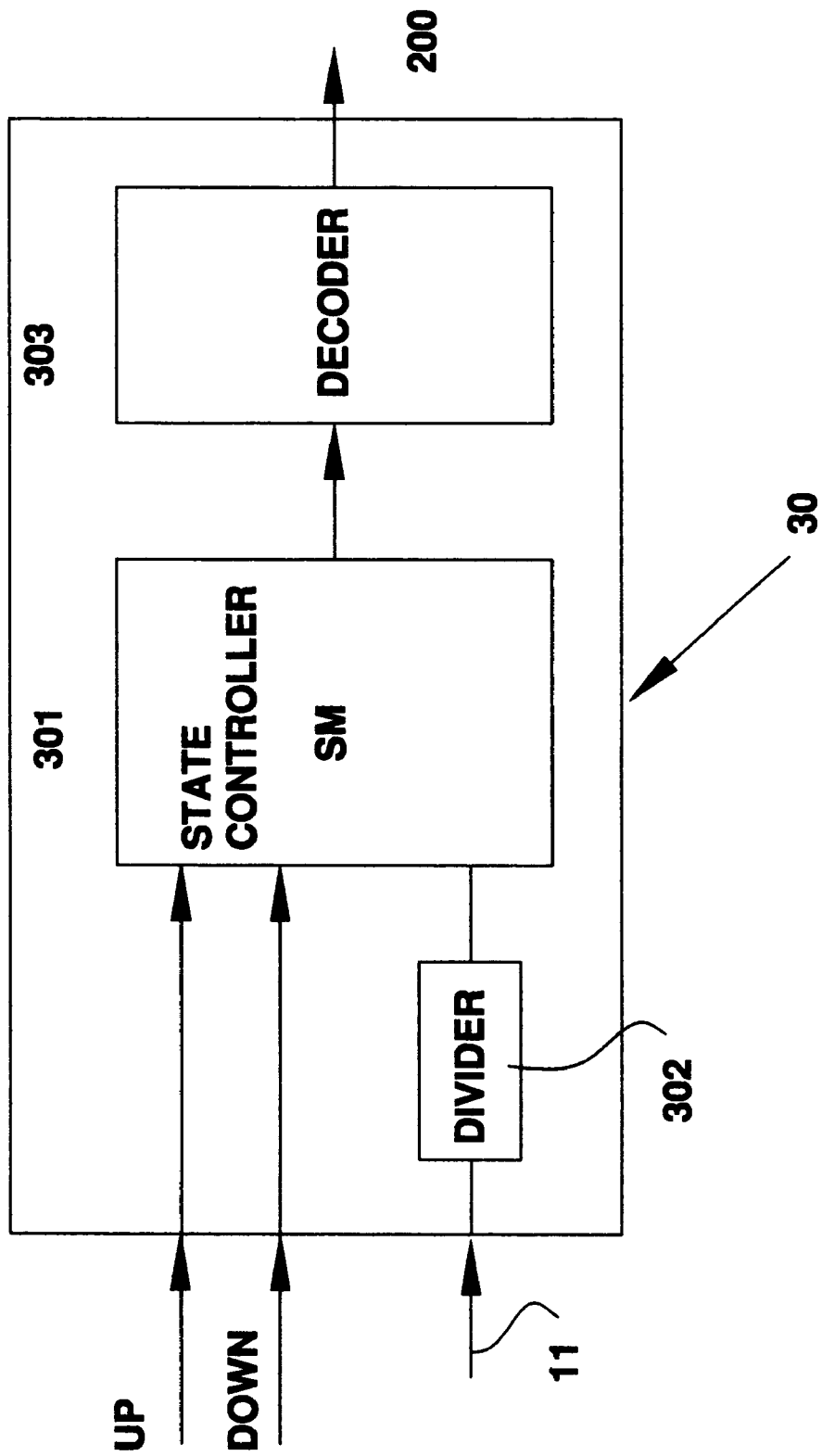
FIG. 6 shows, also in the form of a block diagram, the inner structure of one of the parts shown in FIG. 4.

The diagrams in FIGS. 4 and 6 show, together with FIG. 8, the possible embodiment of such a function of automatic tracking of the optimal characteristic followed by a function of permanence on such characteristics so as to prevent, or in any case to make very improbable (except in case of a radical change in the operating conditions of the device), further characteristic changes. As shown previously in FIG. 1, the aforesaid function is driven by the output signal of the loop filter 4 (line 12 of FIG. 1, shown in the diagram in FIG. 4 in its differential configuration).

In FIG. 4, the reference 30 indicates a configuration control circuit whose output essentially corresponds to the line 200. In other words, the circuit 30 allows making the VCO 5 operate according to a characteristic selectively determined.

The circuit 30 operates when enabled by the input clock CLKIN present on the line 11 and under the control of two signals, respectively defined as rising (UP) signal and falling (DOWN) signal: the sense of "up" and "down" is taken here as the one corresponding to the order according to which the characteristics are presented in the various diagrams in the FIGS. 3A–3C. In practice, the UP signal determines such an intervention of the configuration control circuit 30 as to lead the oscillator 5 to operate on a higher characteristic than the one where it is currently located. The DOWN signal determines an intervention in the opposite direction.

Figure 5A:
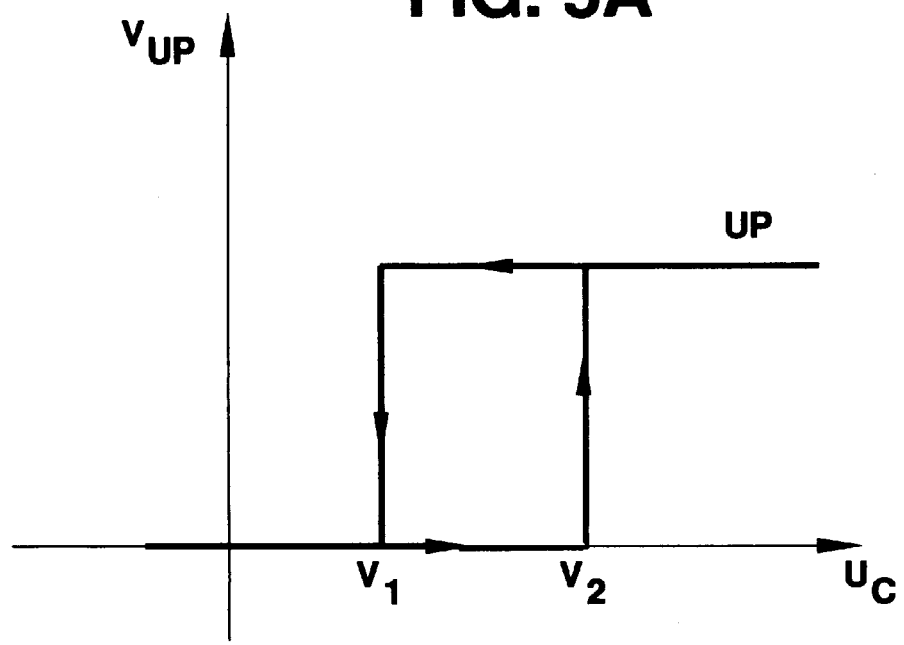
FIGS. 5A and 5B are diagrams which show the operation of a hysteresis module appearing in the element shown in FIG. 4.
Figure 5B:
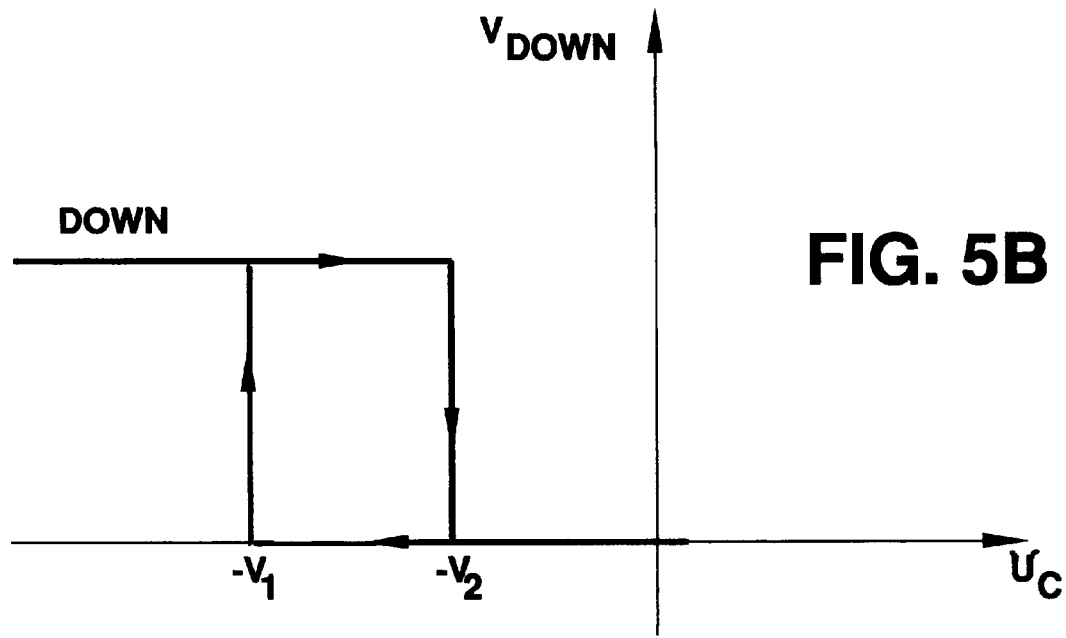

The DOWN and UP signals are produced by a comparator circuit 31 essentially consisting in a double comparator with hysteresis having the characteristics shown in FIGS. 5A and 5B. In these Figures the values of the differential input signal $V_c$ present on the lines 12 are plotted in the x-axes. The y-axes correspond instead to the UP signal (in FIG. 5A) and to the DOWN signal (in FIG. 5B). For the sake of clarity, the "high" value corresponds, in both Figures, to the active state of the related signal, with consequent change in the operating characteristic of the oscillator 5. The "low" value corresponds instead to the absence of output signal. In practice, when both output signals are at the "low" value, the operating characteristic of the oscillator 5 is retained unaltered.

Once the desired operating characteristics are known, the realisation of a circuit of this kind constitutes, for the person skilled in the art, a normal design task. For this reason, in order not to overburden the presentation of the invention, a detailed description of the structure of the circuit 31 is not provided herein.

As better shown in FIG. 6, the circuit 30 essentially consists in a state machine 301 which reads the UP and DOWN signals at the instants identified by a clock signal generated internally, by means of a divider 302, starting from the signal CLKIN present on the line 11, and in a decoder 303 that converts the states of the machine 301 into logic signals suitable for driving the block 27. The state diagram of state machine 301 and the related transitions are shown in FIG. 7.

FIG. 8 refers, for the sake of simplicity and clarity of illustration, to the family of operating characteristics shown in FIG. 3B and shows the two pairs of threshold values $V_1$, $V_2$ and $-V_1'$, $-V_2'$ of the comparator 31.

Still with reference to FIG. 8, let it now be supposed that, upon its activation, the circuit 1 is operating in the point indicated as to ("entry" state). In this state, the oscillator 5 operates at minimum frequency, regardless of the control voltage Vc. This frequency is far lower than the desired one, chosen herein by way of example to correspond to 622 MHz and represented in the figure by a horizontal dashed line.

The general feedback function of the circuit leads then to a voltage increase at the input of the oscillator 5. However, such an input voltage increase is not immediately translated into an increase in the operating frequency of the oscillator 5 which continues operating at the frequency corresponding to point $t_0$ until the input voltage of the oscillator 5 reaches the threshold $V_2$ of the circuit 31.

Once this threshold is reached, the circuit 31 emits the UP signal and, in correspondence with the subsequent rising front of CLKIN, the state machine passes to state 1, thereby selecting the first characteristic. Under those conditions, the operating frequency of the oscillator 5 increases rapidly as is illustrated schematically by the arrow $t_1$.

Upon reaching the cross-over point between the voltage value $V_2$ and the first characteristic, the operating frequency of the oscillator is still lower than the desired value of 622 MHz and consequently the UP signal is still active. As a result thereof, although it has performed its function of tracking the desired frequency on the first characteristic, the comparator 31 intervenes (UP signal) on the configuration control element 30 thereby causing the oscillator to operate on the second characteristic, as shown in $t_2$ at the right-hand side of FIG. 8 (passage to state 2).

All this translates, depending on the voltage value present at that moment at the input of the oscillator, into the recognition of the fact that the frequency generated by the VCO 5 exceeds the desired one. The oscillator 5 thus starts to track the aforesaid frequency by descending backwards along the second characteristic, thereby returning at this point within the upper band $V_1$, $V_2$ of the comparator with hysteresis 31 and becoming stabilised at the working frequency. Although the circuit operates correctly, the working point is not satisfactory because it is at the limits of the characteristic and there is little margin to track variations in the operating conditions. As a result, the comparator continues to present an UP command, which in $t_3$ causes circuit 30 to change state, thus leading the oscillator 5 to operate on the third characteristic (state 3).

At this point, performing the backward tracking function on the third characteristic, the oscillator 5 moves to the desired operating point (arrow $t_4$), which as shown corresponds to an input voltage lower than $V_1$ and to an output frequency equal to the desired frequency of 622 MHz. Now the UP signal is at a low level and the circuit becomes stabilised in the aforesaid operating condition, remaining there even in the presence of rather marked changes in the behaviour of the VCO 5, due for instance to temperature variations, provided—however—that such changes do not cause the oscillator 5 to depart from the central band comprised between the extreme switching levels ($V_2$, $-V_2'$) of the comparator with hysteresis 31.

In the presence of a very marked change in the operating conditions, for instance in the input frequency, the control voltage exceeds $V_2$ or drops below $V_2'$ and a new characteristic is chosen as described above. The result is the generation, by the circuit 31, of the UP or DOWN signal so as to cause, through the configuration control module 30, the oscillator 5, to move to the desired characteristic.

Of course, while the principle of the invention remains unchanged, the construction details and the embodiments may be widely varied with respect to what is described and illustrated herein, without thereby departing from the scope of the present invention. For example, one can directly control the stages 23 of the oscillator 5 with the signal 200.

I claim:

1. A phase locked loop circuit (1), comprising:

a comparator (2) able to generate, starting from an input signal (CLKIN) and from a feedback signal (FBCLK), a deviation signal, a loop filter (4) fed with said deviation signal, and an oscillator (5) to generate, starting from at least one driving signal obtained from said deviation signal filtered by said loop filter (4), an output signal (CLKOUT) locked with said input signal (CLKIN), wherein:

said oscillator (5) is arranged to operate according to a plurality of characteristics that relate said driving signal with said output signal, and control means (27, 81) are provided within the circuit to give rise to said plurality of characteristics and automatically and selectively to control the operation of said oscillator (5) according to a characteristic determined selectively starting from said plurality of characteristics.

2. The circuit as claimed in claim 1, wherein said oscillator is a voltage controlled oscillator (VCO) and said plurality of characteristics comprise characteristics which relate the frequency of said output signal (CLKOUT) with the value of said driving signal.

3. The circuit as claimed in claim 1, wherein said control means (81) comprise at least one control element (30, 31) responsive to said deviation signal, and in that said at least one control element (30, 31) selectively controls the operation of said oscillator (5) according to a characteristic selectively determined starting from said plurality of characteristics as a function of said deviation signal.

4. The circuit as claimed in claim 3, wherein said control element (30, 31) is configured in such a way that:

said selectively determined characteristic is initially determined starting from said plurality of characteristics according to a criterion of optimisation of said deviation signal, and said oscillator (5) is subsequently made to operate on said selectively determined characteristic also in the presence of subsequent variations of said deviation signal.

5. The circuit as claimed in claim 4, wherein said oscillator (5) is subsequently made to operate on said selectively determined characteristic also in the presence of subsequent variations of said deviation signal, until said subsequent variations of said deviation signal reach the borders of at least one respective variation range ($V_2$; $-V_2'$).

6. The circuit as claimed in claim 5, wherein said variation range is delimited, at least at one end, by a hysteresis band ($V_1$, $V_2$; $-V_1'$, $-V_2'$).

7. The circuit as claimed in claim 6, wherein said control element (30, 31) comprises at least one hysteresis module (31) configured as double comparator with hysteresis ($V_1$, $V_2$; $-V_1'$, $-V_2'$).

8. The circuit as claimed in claim 7, wherein said hysteresis module (31) is responsive to said driving signal of the oscillator (5).

9. The circuit as claimed in claim 7, wherein said oscillator (5) is a loop oscillator.

10. The circuit as claimed in claim 8, wherein said control means (81) comprise a logic circuit (30) which applies to said oscillator (5) a respective portion of driving signal (200) that determines the operating characteristic of the oscillator starting from said plurality of characteristics.

* * * * *